United States Patent
Loopstra et al.

(10) Patent No.: US 9,091,944 B2
(45) Date of Patent: Jul. 28, 2015

(54) SOURCE COLLECTOR, LITHOGRAPHIC APPARATUS AND DEVICE MANUFACTURING METHOD

(75) Inventors: Erik Roelof Loopstra, Eindhoven (NL); Vadim Yevgenyevich Banine, Deurne (NL); Gerardus Hubertus Petrus Maria Swinkels, Eindhoven (NL); Sven Pekelder, Breugel (NL); Dzmitry Labetski, Utrecht (NL); Uwe Bruno Heini Stamm, Goettingen (DE); William N. Partlo, Poway, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 391 days.

(21) Appl. No.: 13/497,741

(22) PCT Filed: Sep. 24, 2010

(86) PCT No.: PCT/EP2010/064140
§ 371 (c)(1),
(2), (4) Date: Mar. 22, 2012

(87) PCT Pub. No.: WO2011/036248
PCT Pub. Date: Mar. 31, 2011

(65) Prior Publication Data
US 2012/0182536 A1 Jul. 19, 2012

Related U.S. Application Data

(60) Provisional application No. 61/245,858, filed on Sep. 25, 2009.

(51) Int. Cl.
*G03B 27/54* (2006.01)
*G03F 7/20* (2006.01)
*H05G 2/00* (2006.01)

(52) U.S. Cl.
CPC ........ *G03F 7/70933* (2013.01); *G03F 7/70033* (2013.01); *G03F 7/70175* (2013.01);
(Continued)

(58) Field of Classification Search
CPC ............ G03F 7/70033; G03F 7/70175; G03F 7/70808; G03F 7/7908; G03F 7/70916; G03F 7/70925; G03F 7/70933; H05G 2/003; H05G 2/005
USPC .......................................................... 355/67
See application file for complete search history.

(56) References Cited

U.S. PATENT DOCUMENTS 2,536,610 A 1/1951 King et al.
7,719,661 B2 5/2010 Nishikawa
(Continued)

FOREIGN PATENT DOCUMENTS

EP 1746865 A2 1/2007
JP 2007-35660 2/2007
(Continued)

OTHER PUBLICATIONS

International Search Report for PCT International Patent Application No. PCT/EP2010/064140, mailed Dec. 20, 2010.
(Continued)

*Primary Examiner* — Deoram Persaud
(74) *Attorney, Agent, or Firm* — Pillsbury Winthrop Shaw Pittman LLP

(57) ABSTRACT

An EUV lithographic apparatus includes a source collector apparatus in which the extreme ultraviolet radiation is generated by exciting a fuel to provide a plasma emitting the radiation. The source collector apparatus includes a chamber in fluid communication with a guide way external to the chamber. A pump for circulating buffer gas is part of the guide way, and provides a closed loop buffer gas flow. The gas flowing through the guide way traverses a gas decomposer wherein a compound of fuel material and buffer gas material is decomposed, so that decomposed buffer gas material can be fed back into the closed loop flow path.

18 Claims, 9 Drawing Sheets

(52) U.S. Cl.
CPC ........ *G03F 7/70808* (2013.01); *G03F 7/70908* (2013.01); *G03F 7/70916* (2013.01); *G03F 7/70925* (2013.01); *H05G 2/003* (2013.01); *H05G 2/005* (2013.01)

(56) References Cited

U.S. PATENT DOCUMENTS

| | | | |
|---|---|---|---|
| 8,263,953 B2 * | 9/2012 | Fomenkov et al. | 250/504 R |
| 2006/0163500 A1 * | 7/2006 | Inoue et al. | 250/493.1 |
| 2007/0018119 A1 * | 1/2007 | Yabuta et al. | 250/493.1 |
| 2007/0145297 A1 * | 6/2007 | Freriks et al. | 250/492.2 |
| 2007/0228298 A1 * | 10/2007 | Komori et al. | 250/493.1 |
| 2009/0057567 A1 * | 3/2009 | Bykanov et al. | 250/429 |
| 2009/0135386 A1 | 5/2009 | Nishikawa | |
| 2009/0154642 A1 | 6/2009 | Bykanov et al. | |

FOREIGN PATENT DOCUMENTS

| | | |
|---|---|---|
| JP | 2008-277481 | 11/2008 |
| WO | 01/95362 A1 | 12/2001 |
| WO | 2006/136967 A2 | 12/2006 |
| WO | 2009/032054 | 3/2009 |
| WO | 2009/032055 | 3/2009 |

OTHER PUBLICATIONS

Written Opinion for PCT International Patent Application No. PCT/EP2010/064140, mailed Apr. 5, 2012.

* cited by examiner

SOURCE COLLECTOR, LITHOGRAPHIC APPARATUS AND DEVICE MANUFACTURING METHOD

CROSS-REFERENCE TO RELATED APPLICATIONS

This application is the United States national phase entry of PCT/EP2010/064140, filed Sep. 24, 2010, which claims the benefit of U.S. Provisional Application Ser. No. 61/245,858, which was filed on Sep. 25, 2009, the contents of both of which are incorporated herein in their entireties by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in Equation (1) below:

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from Equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus (also referred to, hereinafter, as a source collector module or source module) for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure arranged to provide a vacuum environment to support the plasma. Such a radiation system is typically termed a laser produced plasma (LPP) source.

In addition to radiation, the plasma of a plasma radiation source produces contamination in the form of particles, such as thermalized atoms, ions, nanoclusters, molecules consisting of fuel atoms bonded to buffer gas atoms, and/or microparticles. Such contamination is also referred to as debris, hereinafter. The contamination is output, together with the desired radiation, from the radiation source towards the radiation collector and may cause damage to the normal incidence radiation collector and/or other parts. For example, LPP sources that use tin (Sn) droplets to produce the desired EUV may generate a large amount of tin debris in the form of: atoms, ions, nanoclusters, and/or microparticles.

It is desirable to prevent the contamination from reaching the radiation collector, where it may reduce EUV power, or from reaching parts of the enclosing structure where it may create other problems. To stop especially the ions, a buffer gas can be used, but with this kind of debris mitigation, a large flow of buffer gas may be needed, which may make it desirable to have large pumps and a large supply of buffer gas. To reduce a volume of the desired supply of buffer gas, the enclosing structure of the source collector module may define a closed loop flow path of the buffer gas disposed in the enclosing structure and a pump forcing the gas through the closed loop flow path. A heat exchanger may be used to remove heat from gas flowing in the flow path, and a filter may be used to remove at least a portion of contamination from gas flowing in the flow path.

SUMMARY

A presence of contamination may not only have a detrimental effect on EUV power, but may also have a detrimental effect on the operability of a pump used for sustaining the aforementioned closed loop flow. It is desirable to further mitigate these effects.

According to an aspect of the invention, there is provided a source collector apparatus for an extreme ultraviolet radiation lithographic apparatus wherein the extreme ultraviolet radiation is generated by exciting a fuel to provide a plasma emitting the radiation, comprising: an enclosing structure constructed and arranged to define a closed loop flow path for a buffer gas disposed in the enclosing structure, a pump constructed and arranged to force the buffer gas through the closed loop flow path, and a gas decomposer constructed and arranged to decompose a compound of fuel material and buffer gas material, and to feed back into the closed loop flow path at least a portion of said buffer gas material.

According to an aspect of the invention, there is provided a lithographic apparatus comprising an illumination system configured to condition a radiation beam, a support structure constructed to hold a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, and the source collector apparatus as described above.

According to a further aspect of the invention, there is provided a device manufacturing method comprising projecting a patterned beam of radiation onto a substrate, wherein, in a source collector apparatus of the extreme ultraviolet radiation lithographic apparatus used for the manufacturing, extreme ultraviolet radiation is generated by exciting a fuel to provide a plasma emitting the radiation and collected by a reflective collector, comprising forcing a buffer gas through a closed loop flow path which traverses an area between the collector and the radiation emitting plasma, decomposing a compound of fuel material and buffer gas material, and feeding back into the closed loop flow path at least a portion of said buffer gas material.

According to an aspect of the present invention, there is provided a lithographic apparatus that includes a source collector apparatus. The source collector apparatus includes an enclosing structure constructed and arranged to define a closed loop flow path for a buffer gas in the enclosing structure, a pump constructed and arranged to force the buffer gas through the closed loop flow path, a gas decomposer constructed and arranged to decompose a compound of fuel material and buffer gas material, and to feed back into the closed loop flow path at least a portion of said buffer gas material, and a collector constructed and arranged to collect extreme ultraviolet radiation emitted by a plasma formed from the fuel material. The lithographic apparatus also includes an illumination system configured to condition the collected extreme ultraviolet radiation and form a radiation beam, and a support structure constructed to hold a patterning device. The patterning device is capable of imparting the radiation beam with a pattern in its cross-section to form a patterned radiation beam. The lithographic apparatus also includes a substrate table constructed to hold a substrate, and a projection system configured to project the patterned radiation beam onto a target portion of the substrate.

According to an aspect of the present invention, there is provided a device manufacturing method that includes generating extreme ultraviolet radiation by exciting a fuel to provide a plasma emitting the radiation, collecting the radiation with a reflective collector in a source collector apparatus, forcing a buffer gas through a closed loop flow path which traverses an area between the collector and the radiation emitting plasma, decomposing a compound of fuel material and buffer gas material, feeding back into the closed loop flow path at least a portion of said buffer gas material, patterning the collected radiation into a patterned beam of radiation, and projecting the patterned beam of radiation onto a substrate.

According to an aspect of the invention the fuel as mentioned above comprises tin and the buffer gas as mentioned above comprises hydrogen.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
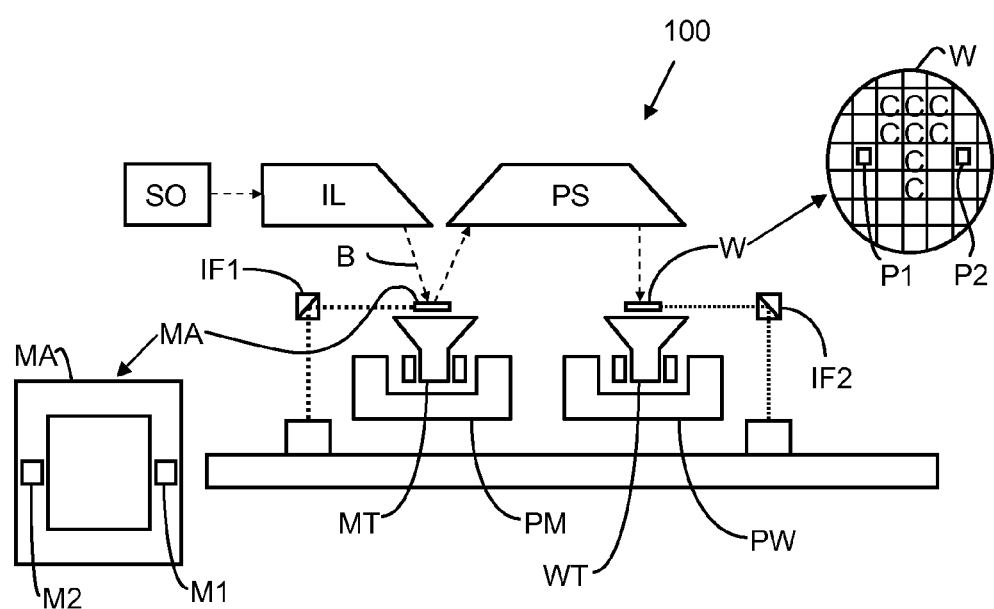
FIG. 1 depicts a lithographic apparatus according to an embodiment of the invention.

FIG. 1 schematically depicts a lithographic apparatus 100 that includes a source collector apparatus SO according to an embodiment of the invention. The lithographic apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The latter devices may be part of the aforementioned adjuster. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted lithographic apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
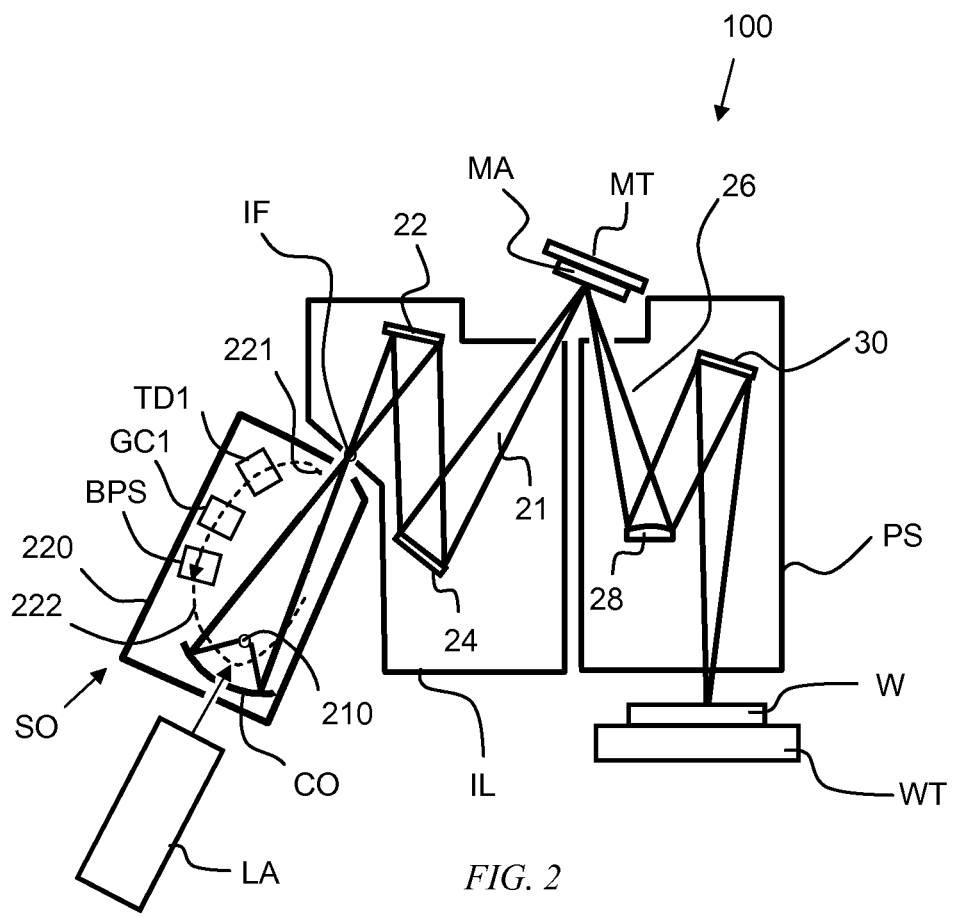
FIG. 2 depicts details of a source collector apparatus as well as of an illumination system and a projection system of the lithographic apparatus illustrated in FIG. 1.

FIG. 2 shows the projection apparatus 100 in more detail, including the source collector apparatus SO, the illumination system IL, and the projection system PS. The source collector module is constructed and arranged such that a vacuum environment can be maintained in an enclosing structure 220 of the source collector module SO. In a typical set up, the atmosphere in the enclosing structure 220 is limited to gases having relatively low absorptance of in-band EUV radiation. The source collector apparatus SO is part of an LPP radiation system; a laser LA is arranged to deposit laser energy into a fuel, such as xenon (Xe), tin (Sn) or lithium (Li), creating a highly ionized plasma 210 with electron temperatures of several 10's of eV. The energetic radiation generated during de-excitation and recombination of these ions is emitted from the plasma, collected by a near normal incidence collector optic CO and focused onto an opening 221 in the enclosing structure 220. At or near this opening 221 an image IF of the radiation emitting plasma 210 is formed. The image IF is often called the intermediate focus.

Subsequently, the radiation traverses the illumination system IL, which may include a facetted field mirror device 22 and a facetted pupil mirror device 24 arranged to provide a desired angular distribution of the radiation beam 21, at the patterning device, as well as a desired uniformity of radiation intensity at the patterning device (and at a substrate W). A patterned beam 26 is formed upon reflection of the beam of radiation 21 at the patterning device MA, held by the support structure MT, and the patterned beam 26 is imaged by the projection system PS via reflective elements 28, 30 onto the substrate W held by the wafer stage or substrate table WT. More elements than shown may generally be present in illumination optics unit IL and projection system PS.

Instead of a near normal incidence mirror as collector mirror CO a grazing incidence normal incidence collector may be applied. Such a collector features nested reflectors disposed axially symmetric around an optical axis and is preferably used in combination with a discharge produced plasma source, often called a DPP source.

The EUV radiation emitting plasma 210 is contained in the vacuum environment maintained in the enclosing structure 220 of the source collector module SO.

Besides EUV radiation, the plasma 210 generates a large amount of fuel debris in the form of high energy ions, fuel vapor, neutral atoms and fuel micro droplets. Of these types of debris, the most hazardous for a mirror coating of the collector CO are the high energy ions. Bombardment of the collector by high energy ions may have a detrimental effect on the reflectance in the EUV band, and hence on the life time of the collector. To increase the collector lifetime, the effect of high energy ions is mitigated by providing a buffer gas flowing along a path 222 between the collector CO and the plasma 210. As a buffer gas, typically hydrogen may be used. As the high energy ions travel through hydrogen, they interact with $H_2$ molecules, and release their energy into the buffer gas so that even if they reach a collector surface, they do not have enough energy to permanently damaged it. Typically a flow of $H_2$ of more than 150 slm (standard liters per minute) is going to be used for the current and future LPP EUV sources.

To reduce the supply of buffer gas, the source collector module SO comprises, within its enclosing structure 220, a pump BPS constructed and arranged to force the buffer gas through the closed loop flow path. A heat exchanger GC1 may be used to remove heat from gas flowing in the flow path, and a filter, not shown in FIG. 2, may be used to remove at least a portion of contamination and debris from gas flowing in the flow path.

It is appreciated that the plasma 210 also generates contamination in the form of fuel buffer-gas compounds. For example, in this embodiment the fuel may be tin, in which case the contamination includes tin hydrides such as $SnH_4$ and/or $SnH_x$. According to an aspect of embodiments of the invention, there is provided, within the enclosing structure 220, a tin hydride decomposer TD1. It is appreciated that the molar fraction of the $SnH_4$ or $SnH_x$ may be up to a few percent in the gas flow. In order to supply $H_2$ back to the enclosing structure 220, the tin-hydrides are preferably removed by decomposition instead of by filtering. An aspect of the invention is to provide a tin-hydride decomposer wherein tin hydride decomposition is based on a first order heterogeneous reaction. Such a reaction has a reaction rate which increases with increasing temperature. Therefore, it is desirable for the tin-hydride decomposer TD1 to be constructed and arranged such that it can be operated at an elevated temperature, and such that sufficient contact between $SnH_4$ or $SnH_x$ molecules and a decomposer surface is facilitated by providing a sufficiently extended or sufficiently long interaction area on the surface. The decomposing of tin hydrides in the present embodiment not only may lead to a lower risk of pump failure, but also to a lower consumption of buffer gas, since decomposed hydrogen is feed back into the enclosing structure.

Figure 3:
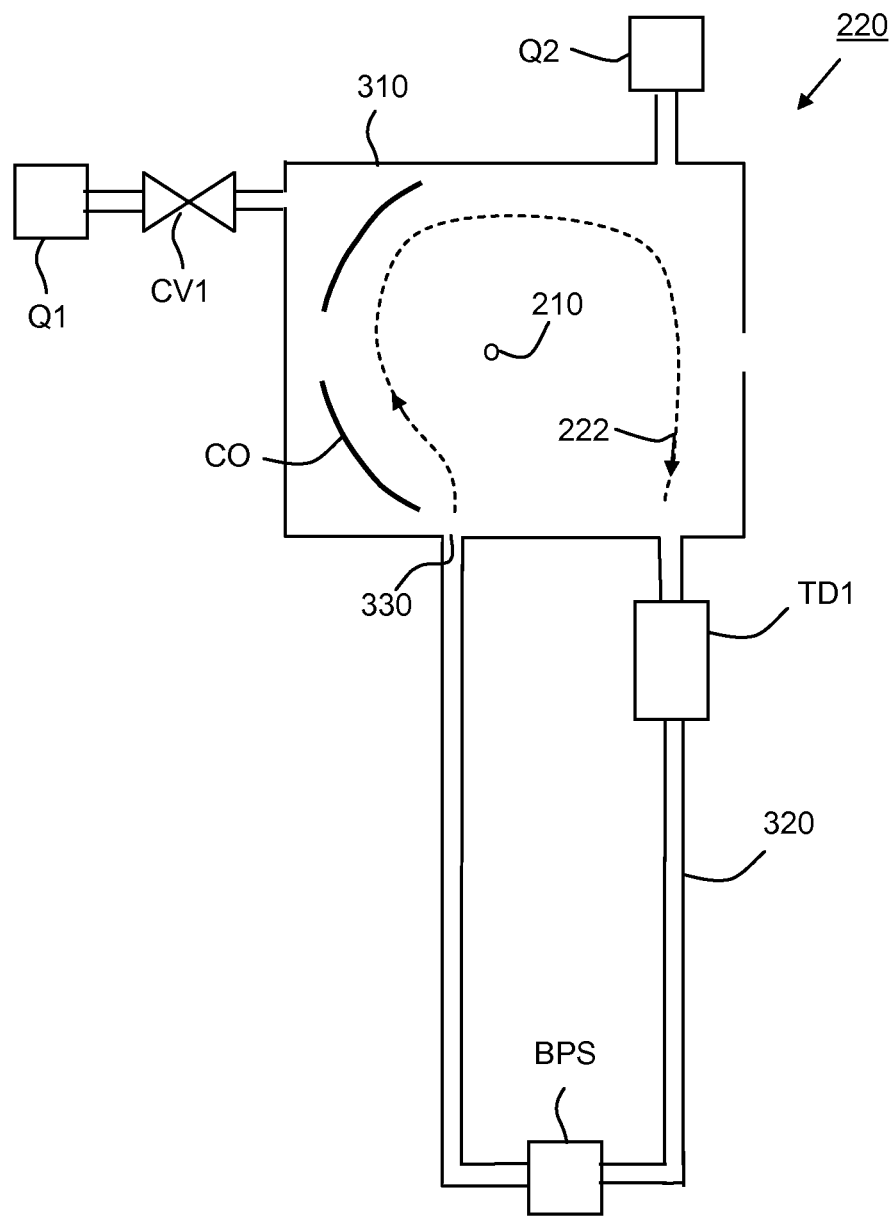
FIG. 3 depicts a closed flow path system including buffer gas sources, a pump and a gas decomposer.

According to an aspect of the invention, and as illustrated in FIG. 3, the aforementioned closed loop flow is realized by forming the enclosing structure 220 as a chamber 310 in fluid communication with a guide way 320 external to the chamber and wherein the pump BPS and the gas decomposer TD1 are disposed in the guide way. In principle, the gas decomposer may be disposed either upstream or downstream of the pump BPS. In both cases, detrimental effects of tin hydrides on collector lifetime as well as pump lifetime may be mitigated. The provision of an external guide way 320 can be arranged such that $H_2$ gas resulting from $SnH_4$ or $SnH_x$ decomposition can be delivered to the chamber 310 through one or more inlets 330 disposed proximate to an area between the collector CO and the plasma 210 where desirably the buffer gas is least contaminated. As schematically depicted in FIG. 3, one or more sources Q1 and/or Q2 of clean hydrogen may be provided in fluid communication with the enclosing structure 220 or more specifically the chamber 310 to compensate for loss of hydrogen in the closed loop flow. Further, one or more valves such as valve CV1 in FIG. 3 may be used to control the flow. The gas sources Q1 and Q2 supply clean $H_2$ to the chamber 310, and the amount of the supplied flow of clean hydrogen is a small fraction, ~10%, of the flow recirculating in the system. The amount of the supplied flow of clean hydrogen may, in an embodiment, be a fraction, in the range of 5-20% of the flow recirculating in the system. The supplied flow is regulated using the control valve CV1. According to an aspect, the pump BPS may be a system of pumps including a number of pumps arranged in series, or a number of pumps arranged in parallel or a number of pumps arranged in series in combination with a number of pumps arranged in parallel. The pumps may be booster pumps.

Figure 4:
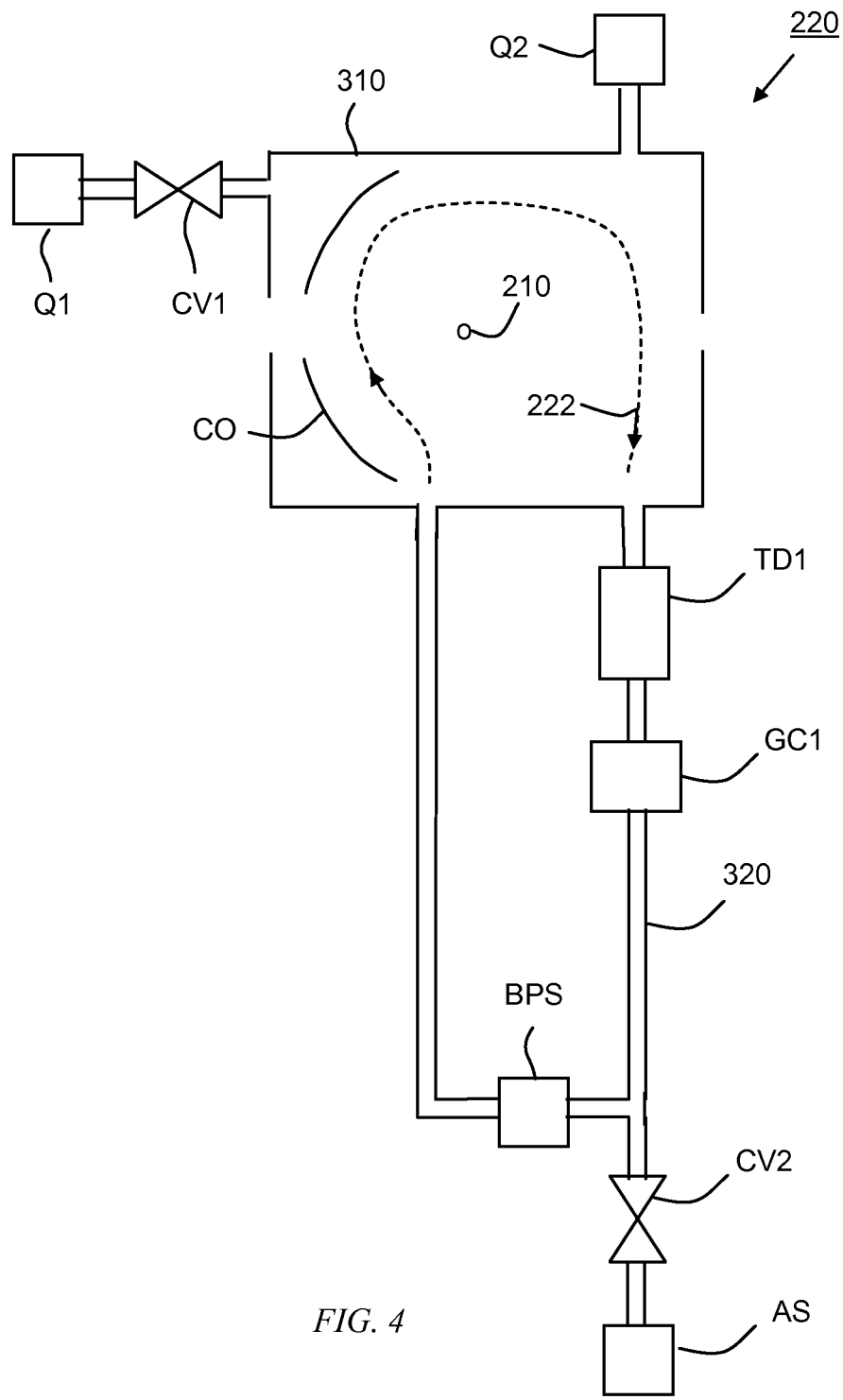
FIG. 4 depicts the system of FIG. 3, further including an abatement system.

In an embodiment, the gas decomposer TD1 is disposed upstream of the pump BPS, as illustrated in FIG. 4. Contaminated $H_2$ coming from the chamber 310 passes through the tin-hydride decomposer, TD1, where the most energetic tin-hydrides are decomposed, preventing Sn deposition in the booster pump stack, BPS. According to an aspect of the invention there is provided a heat exchanger GC1, also referred to as a gas cooler GC1, constructed and arranged to remove heat from gas flowing in the flow path traversing the external guide 320, and disposed between the gas decomposer TD1 and the pump BPS. In the cooler GC1, the gas flow is cooled to room temperature. At this temperature, tin hydride decomposition takes more than 10 minutes, which is long enough for $SnH_4$ or $SnH_x$ molecules to travel through the boost pump stack BPS without decomposition. In addition, the gas can be cooled down below the room temperature to reduce or even avoid $SnH_4$ or $SnH_x$ decomposition on the hot parts of the pump BPS.

According to an aspect of the invention and as further illustrated in FIG. 4, in an embodiment, the guide way 320 may include an outlet disposed between the pump BPS and the gas decomposer TD1 to establish a fluid connection with an abatement system AS; a valve CV2 is arranged to control a flow of gas exiting the enclosing structure and directed to the abatement system AS. A small fraction, ~10%, of the flow recirculating in the system may be directed to the abatement system AS. The fraction directed to the abatement system AS may, in an embodiment, be a fraction, in the range of 5-20% of the flow recirculating in the system.

Figure 5:
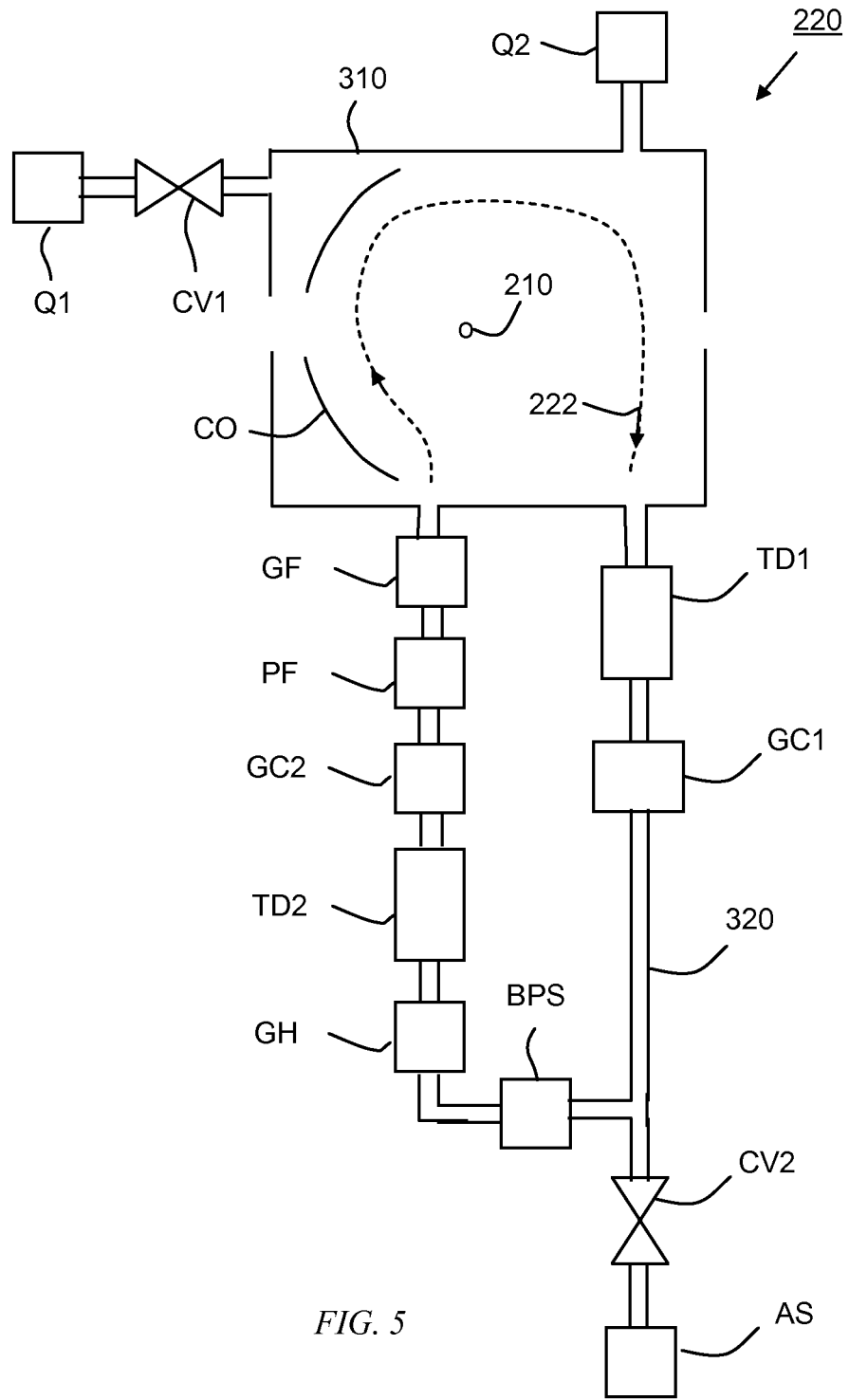
FIG. 5 depicts the system of FIG. 4, further including a supplementary gas decomposer.

In an embodiment, and as illustrated in FIG. 5, there is provided, in relation to the embodiment shown in FIG. 4 and described above, a supplementary gas decomposer TD2 disposed in the guide way 320 downstream of the pump BPS. It is appreciated that a relative high decomposition efficiency may be difficult to achieve when a relative pressure drop over a tin hydride decomposer of the type described here is relatively high, which may be the case when the gas decomposer is operated at a relative low pressure. The gas decomposer TD1 is operated at a relatively low pressure in relation to the pressure at which the gas decomposer TD2 is operated, so that as mentioned above, at least the most energetic tin-hydrides are decomposed, thereby preventing Sn deposition in the booster pump stack BPS. The provision of a further supplementary gas decomposer may further improve the overall tin hydride decomposition efficiency of the source collector module. In the illustrated embodiment, the pump BPS may compress gas more than by factor 5, so that the gas decomposer TD2 may be operated at a relatively high pressure in relation to the pressure at which the gas decomposer TD1 is operated, thereby leading to a relative pressure drop which is relatively low. This provision may mitigate an effect of the less favorable condition under which the gas decomposer TD1 is operated.

According to an aspect of the invention, and as further illustrated in FIG. 5, there may be provided a heat exchanger GH constructed and arranged to provide heat to gas flowing in said flow path and disposed in the guide way 320 between the supplementary gas decomposer TD2 and the pump BPS. Upon compression of the gas by pump BPS by more than by factor 5, the gas enters the gas heater, GH, where it is heated up to a temperature at which efficient $SnH_4$ or $SnH_x$ decomposition in the tin-hydrides decomposer TD2 is possible. After traversing the decomposer TD2, the gas may be cooled down in an heat exchanger or gas cooler GC2, constructed and arranged to remove heat from gas flowing in said flow path, and disposed in the guide way 320 downstream of the supplementary gas decomposer TD2. Next, the $H_2$ flow without substantially any $SnH_4$ or $SnH_x$ may be directed trough a particle filter PF and a gas filter GF so that substantially clean $H_2$ is supplied back to the chamber 310.

In an embodiment the gas decomposers as described above, are constructed and arranged such that a characteristic time $t_{dec}$ for $SnH_4$ or $SnH_x$ decomposition is larger than the residence time $t_{res}$ of the $SnH_4$ or $SnH_x$ molecules whilst traversing the decomposer. Equation (2) expresses $t_{res}$ as follows:

$$t_{res} = \frac{LPA}{Q} \quad (2)$$

where P [Pa] is a pressure in the decomposer, A [m^2] is an average decomposer cross section, and L [m] is a length that gas travels through the decomposer. A total gas flow at the decomposer temperature is represented by Q in Equation (2); Q may be expressed in [Pa·m^3/s] or in standard liters per minute [slm]. For example, the flow may be 300 slm, the decomposer cross-section may correspond to a cross section of a circular pipe of 400 mm diameter, the gas travelling distance in the decomposer may be 5 m, the decomposer temperature may be 500° C., and the pressure may be 120 Pa. In this case, the residence time $t_{res}$ is 0.052 sec.

Figure 6:
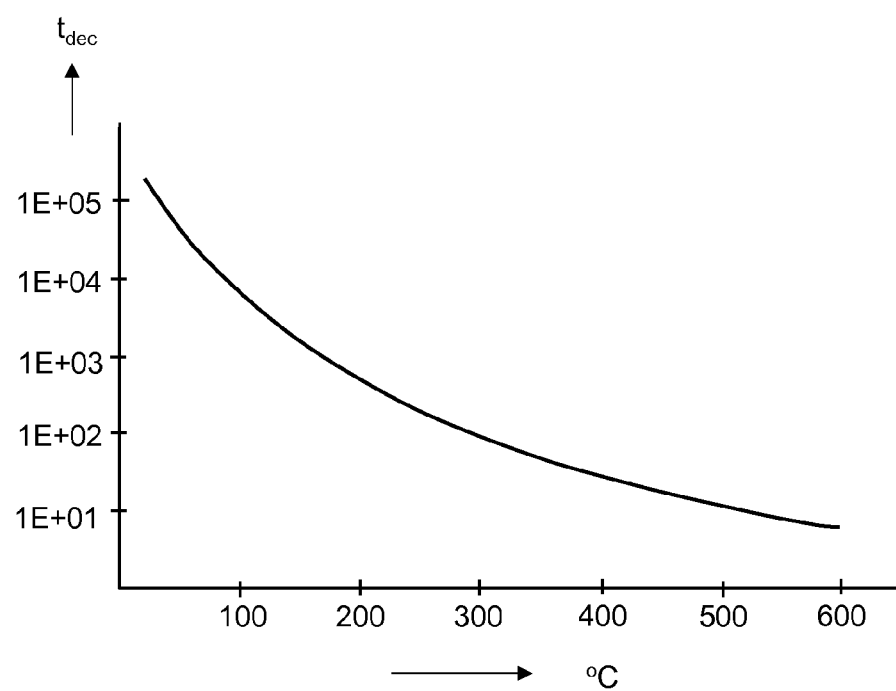
FIG. 6 illustrates a plot of characteristic time of $SnH_4$ or $SnH_x$ decomposition as a function of temperature.

In FIG. 6 the characteristic time $t_{dec}$ of the $SnH_4$ or $SnH_x$ decomposition is plotted, in seconds, along a vertical axis, as function of temperature in degrees Centigrade along a horizontal axis. The data between 20° C. and 100° C. is taken from publicly available evidence; the points at temperatures larger than 100° C. are an extrapolation of this data. At 500° C., the characteristic time $t_{dec}$ is about 10 sec, which is significantly larger than the residence time $t_{res}$ calculated in the paragraph above.

To match both numbers, $t_{dec}$ and $t_{res}$, it is desirable to increase the gas travelling length, the gas pressure (which might be limited by source operational conditions), and the decomposer temperature.

Figure 7:
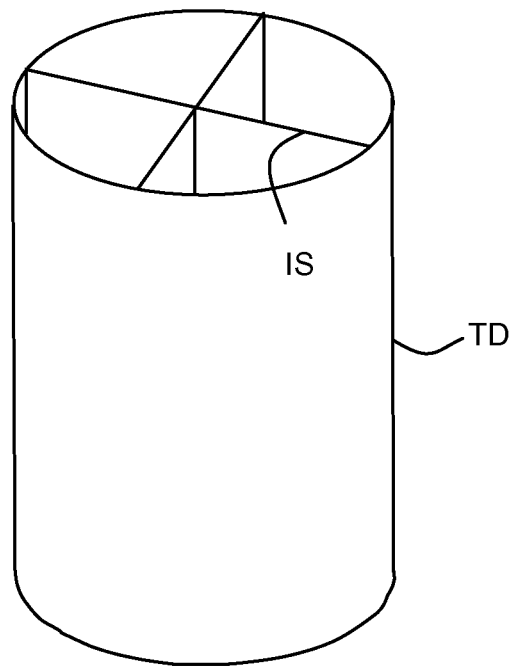
FIG. 7 depicts a design of a circular gas decomposer with an insert to provide a certain characteristic distance d between decomposer surfaces.
Figure 7:
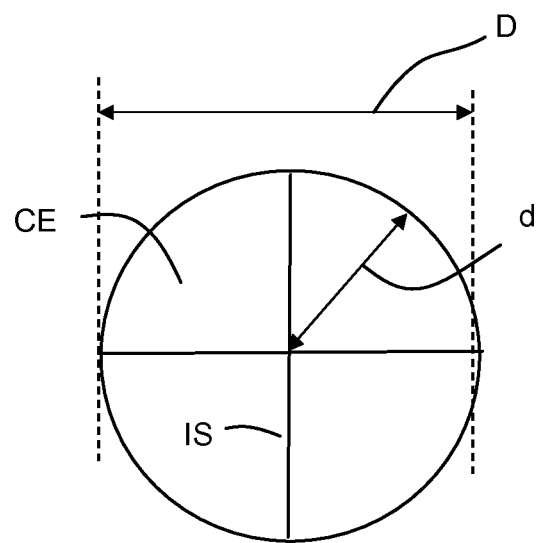

The residence time of $SnH_4$ or $SnH_x$ molecules in the decomposer should be large enough that molecules have enough time to diffuse to the decomposer surfaces. The characteristic diffusion length, $L_{diff}$, is expressed as $$L_{diff} = \sqrt{4D_c t_{res}} \quad (3)$$

where $D_c$ is the $SnH_4$ or $SnH_x$ diffusion coefficient. The characteristic length d between the decomposer surfaces at a cross-section of the decomposer should be equal to the diffusion length, $L_{diff}$. As illustrated in FIG. 7, for the decomposer TD with a circular cross-section, an insert IS can be used to provide the desired characteristic length d. The same principle can be used for the decomposers with other shape of the cross-section. A number n of cells CE in the insert can be calculated using the following simple relation:

$$n = \left(\frac{D}{L_{diff}}\right)^2 \quad (4)$$

where D is the pipe diameter, e.g. the diameter of the cylindrical wall of the decomposer as illustrated in FIG. 7.

Figure 8:
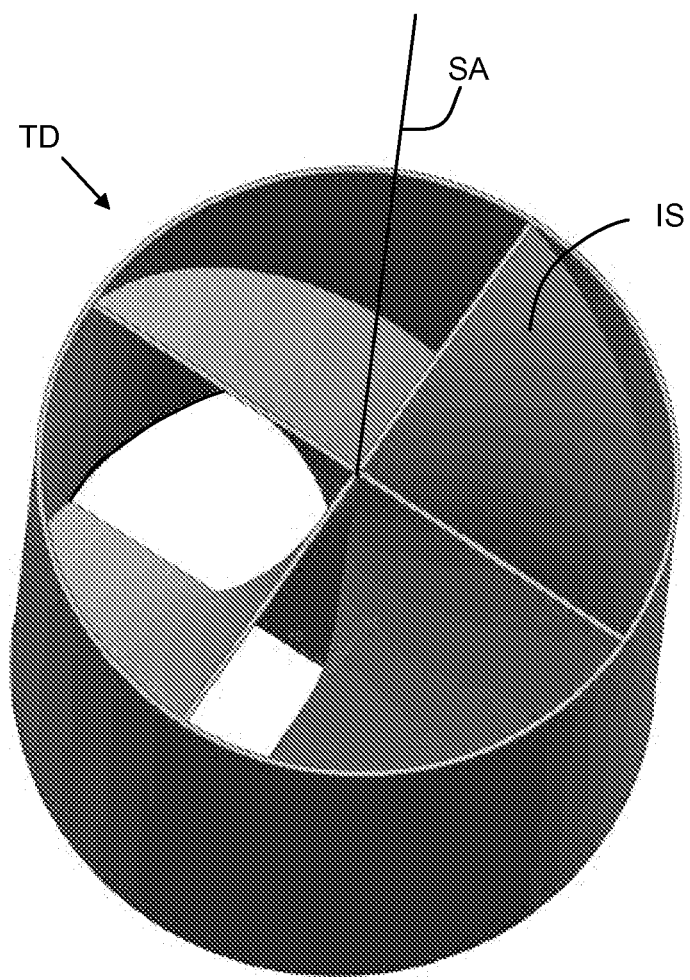
FIG. 8 depicts a gas decomposer with a twisted insert.

To further increase the gas travelling length, the insert IS can be twisted around a symmetry axis SA of the decomposer TD, as shown in FIG. 8. It is appreciated that the twisted arrangement enables keeping a size of the decomposer relatively small and maintaining a still acceptable flow conductance of the twisted structure.

According to an aspect of the invention, an $SnH_4$ decomposition efficiency can be improved, desirably at the start of decomposer operation, by pre-covering the decomposer surface with Sn or another metal, for example, copper, Cu. It is appreciated that at least a portion of the surface or surfaces of an insert IS may be precovered with tin or copper, or that at least a portion of an inner surface of the decomposer exposed to a flow of fuel-buffer gas compound may be precovered with tin or copper.

Figure 9:
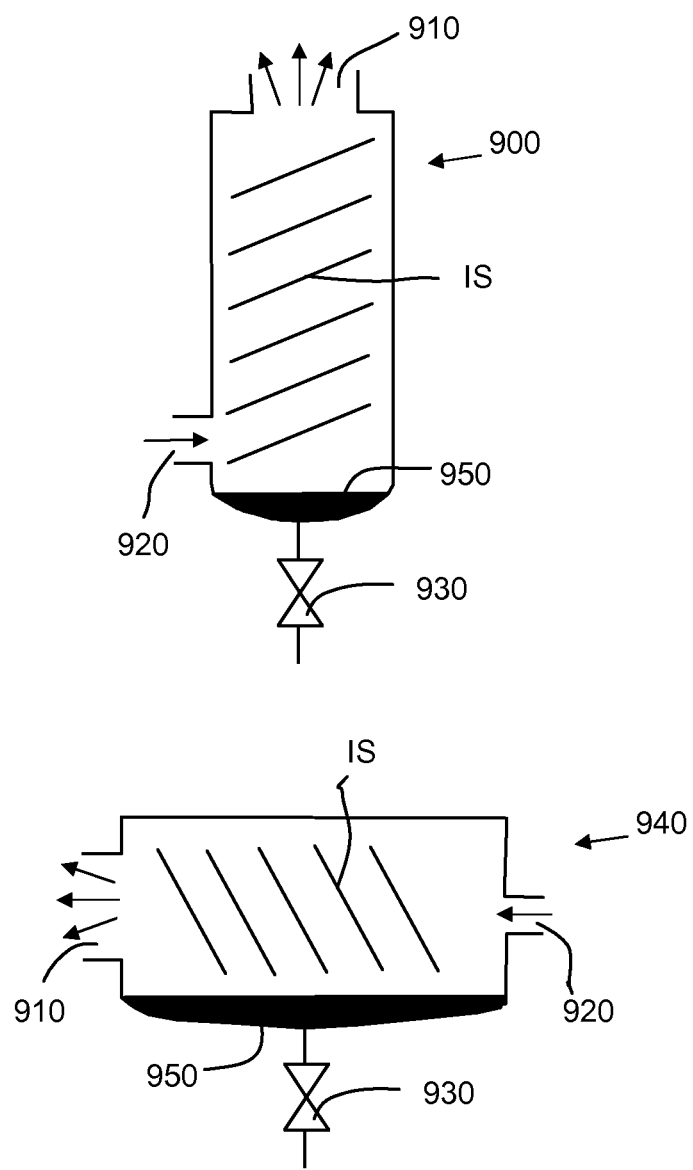
FIG. 9 depicts a gas decomposer in a vertical orientation and a gas decomposer in a horizontal orientation according to embodiments of the invention.

In any of the embodiments described above, the gas decomposers TD1 and/or TD2 may be operated at an elevated temperature. For a gas decomposer at a temperature below 232° C., the tin melting temperature, tin is deposited on the decomposer walls. When large amount of Sn is accumulated in the decomposer, it should be replaced. Alternatively, the decomposer is kept at a temperature above 232° C. In this case, and as illustrated schematically in FIG. 9, liquid tin 950 can be directed via one ort more inserts IS by the gravity force to a reservoir of the decomposer arranged to capture liquid tin 950 and to direct liquid tin 950 to a drainage 930. In this embodiment, a replacement of the gas decomposer may not be needed. In FIG. 9, tin hydride decomposers 900 and 940 are oriented vertically and horizontally, respectively. The tilted bars schematically illustrate inserts IS. The openings 920 are inlets for a mixture of hydrogen and tin hydride, and the openings 910 are outlets for hydrogen.

In an embodiment, the heat exchanger GC1 is arranged to cool the gas in the flow to a temperature of around 30° C., or a temperature in the range of about 20° C. to about 40° C. A design of the gas cooler may be similar to the above described design of a gas decomposer. The gas residence time in the gas cooler GC1 is desirably comparable to a characteristic time of heat diffusion from the gas to cooler walls. The residence time is given by Equation 2. A characteristic length $L_h$ for heat diffusion is expressed as $$L_h = \sqrt{4\frac{k}{C_p\rho}t_{res}} \quad (5)$$

where k is a heat conductance coefficient, $C_p$ is the gas heat capacity, and $\rho$ is the gas density. Again as for the decomposer, an insert can be used to control the characteristic length d between the cooler surfaces at the cross-section, see FIG. 7. The characteristic length d should be equal to the heat diffusion length, $L_h$. The same principle can be used for the cooler with other shape of the cross-section. The number n of cells in the insert can be calculated using Equation (4), where $L_{diff}$ is replaced with $L_h$. The cooler surfaces are kept at constant temperature close to room temperature.

It is appreciated that the gas cooler can have an additional functionality: by cooling gas flow from the source down to temperature below −52° C., tin hydride is liquefied and it may be removed through a drainage system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of extreme ultra-violet (EUV) radiation (e.g. having a wavelength in the range of 5-20 nm).

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A source collector apparatus for an extreme ultraviolet radiation lithographic apparatus wherein the extreme ultraviolet radiation is generated by exciting a fuel to provide a plasma emitting the radiation, the source collector apparatus comprising:
    an enclosing structure constructed and arranged to define a closed loop flow path for a buffer gas in the enclosing structure;
    a pump constructed and arranged to force the buffer gas through the closed loop flow path; and
    a gas decomposer constructed and arranged to decompose a compound of fuel material and buffer gas material, and to feed back into the closed loop flow path at least a portion of said buffer gas material,
    wherein the gas decomposer comprises a pipe surrounding at least one insert, and
    wherein a characteristic length between a surface of the insert and a surface of the pipe at a cross-section of the decomposer is equal to a diffusion length of the compound of fuel material.

2. The source collector apparatus of claim 1, wherein the enclosing structure comprises a chamber in fluid communication with a guide way external to the chamber, and wherein the pump and the gas decomposer are positioned in the guide way.

3. The source collector apparatus of claim 2, wherein the gas decomposer is positioned upstream of the pump.

4. The source collector apparatus of claim 3, wherein a heat exchanger constructed and arranged to remove heat from gas flowing in said flow path is positioned between the gas decomposer and the pump.

5. The source collector apparatus of claim 4, wherein a supplementary gas decomposer is positioned in the guide way downstream of the pump.

6. The source collector apparatus of claim 5, wherein a second heat exchanger constructed and arranged to provide heat to gas flowing in said flow path is positioned in the guide way between the supplementary gas decomposer and the pump.

7. The source collector apparatus of claim 6, wherein a third heat exchanger constructed and arranged to remove heat from gas flowing in said flow path is positioned in the guide way downstream of the supplementary gas decomposer.

8. The source collector apparatus of claim 3, wherein the guide way includes an outlet between the pump and the gas decomposer and an abatement system in fluid connection with the outlet and constructed and arranged to provide and control a flow of gas exiting the enclosing structure.

9. The source collector apparatus of claim 1, wherein the enclosing structure is formed with an inlet connected to a buffer gas source.

10. The source collector apparatus of claim 1, wherein the fuel comprises tin and the buffer gas comprises hydrogen.

11. The source collector apparatus of claim 10, wherein the compound is a tin hydride.

12. The source collector apparatus of claim 10, wherein the gas decomposer comprises a structure maintained at a temperature above 232° C.

13. The source collector apparatus of claim 12, wherein the structure comprises a reservoir and drain.

14. The source collector apparatus of claim 1, wherein the insert is a twisted insert.

15. A lithographic apparatus comprising:
    a source collector apparatus comprising
        an enclosing structure constructed and arranged to define a closed loop flow path for a buffer gas in the enclosing structure,
        a pump constructed and arranged to force the buffer gas through the closed loop flow path,
        a gas decomposer constructed and arranged to decompose a compound of fuel material and buffer gas material, and to feed back into the closed loop flow path at least a portion of said buffer gas material, wherein the gas decomposer comprises a pipe surrounding at least one insert, and wherein a characteristic length between a surface of the insert and a surface of the pipe at a cross-section of the decomposer is equal to a diffusion length of the compound of fuel material, and
    a collector constructed and arranged to collect extreme ultraviolet radiation emitted by a plasma formed from the fuel material;

an illumination system configured to condition the collected extreme ultraviolet radiation and form a radiation beam;

a support structure constructed to hold a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

16. A device manufacturing method comprising:

generating extreme ultraviolet radiation by exciting a fuel to provide a plasma emitting the radiation;

collecting the radiation with a reflective collector in a source collector apparatus;

forcing a buffer gas through a closed loop flow path which traverses an area between the collector and the radiation emitting plasma;

decomposing a compound of fuel material and buffer gas material in a gas decomposer comprising a pipe surrounding at least one insert, wherein a characteristic length between a surface of the insert and a surface of the pipe at a cross-section of the decomposer is equal to a diffusion length of the compound of fuel material;

feeding back into the closed loop flow path at least a portion of said buffer gas material;

patterning the collected radiation into a patterned beam of radiation; and projecting the patterned beam of radiation onto a substrate.

17. The method of claim 16, wherein the fuel comprises tin and the buffer gas comprises hydrogen.

18. The method of claim 17, wherein the compound is a tin hydride.

* * * * *